(12) United States Patent
Tseng et al.

(10) Patent No.: US 8,854,234 B1
(45) Date of Patent: Oct. 7, 2014

(54) DECOMPRESSION CIRCUIT AND ASSOCIATED DECOMPRESSION METHOD

(71) Applicant: MStar Semiconductor, Inc., Hsinchu Hsien (TW)

(72) Inventors: Yu-Hsiang Tseng, Hsinchu Hsien (TW); Chih-Hao Chang, Hsinchu Hsien (TW); Cheng-Yu Hsieh, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 14/018,511

(22) Filed: Sep. 5, 2013

(30) Foreign Application Priority Data

Apr. 2, 2013 (TW) ................................. 102111970

(51) Int. Cl.
*H03M 7/30* (2006.01)
*H03M 7/40* (2006.01)

(52) U.S. Cl.
CPC .......... *H03M 7/3086* (2013.01); *H03M 7/4012* (2013.01)
USPC ........................................... 341/51; 341/107

(58) Field of Classification Search
CPC ............ H03M 7/3084; H03M 7/3086; H03M 7/3088; H03M 7/4006; H03M 7/4012; H03M 7/4018
USPC .............................................. 341/51, 87, 107
See application file for complete search history.

(56) References Cited

U.S. PATENT DOCUMENTS

| | | | |
|---|---|---|---|
| 6,215,906 B1 * | 4/2001 | Okada | 382/239 |
| 7,492,290 B1 * | 2/2009 | Schneider | 341/67 |
| 7,688,233 B2 * | 3/2010 | Schneider | 341/51 |
| 8,593,308 B1 * | 11/2013 | Biran et al. | 341/65 |
| 2007/0154106 A1 * | 7/2007 | Koziarz | 382/244 |

* cited by examiner

*Primary Examiner* — Howard Williams
(74) *Attorney, Agent, or Firm* — WPAT, PC; Justin King

(57) ABSTRACT

A decompression circuit includes a first decompression unit and a second decompression unit. The first decompression unit performs a first decompression operation on data to generate first decompressed data. The first decompressed data includes a plurality of literals and a distance-length pair. The second decompression unit receives the first decompressed data, and sequentially performs a second decompression operation on the literals and the distance-length pair to generate second decompressed data. After the second decompression unit receives the distance-length pair from the first decompression unit and before the second decompression unit completes decompressing the distance-length pair, the second decompression unit transmits data required for the subsequent first decompression operation performed by the first decompression unit to the first decompression unit according to the distance-length pair.

16 Claims, 3 Drawing Sheets

DECOMPRESSION CIRCUIT AND ASSOCIATED DECOMPRESSION METHOD

This application claims the benefit of Taiwan application Serial No. 102111970, filed Apr. 2, 2013, the subject matter of which is incorporated herein by reference.

BACKGROUND OF THE INVENTION

1. Field of the Invention

The invention relates in general to a decompression circuit, and more particularly to a Lempel-Ziv-Markov chain-Algorithm (LZMA) decompression circuit and associated decompression method.

2. Description of the Related Art

In a decompression operation using the Lempel-Ziv-Markov chain-Algorithm (LZMA), a repeating string is compressed into a distance-length pair. For example, a string "ABCDABCE" is compressed into "A, B, C, D, (4, 3), E", where (4, 3) is referred to as a distance-length pair that represents first three literals (i.e., A, B, and C, "length") of four previous literals (distance). Another compression operation is then performed to generate compressed data. In a decompression process, the compressed data is decompressed, by binary arithmetic coding (BAC), into "A, B, C, D, (4, 3), E", which is then restored to "ABCDABCE" using an LZ77 decompression operation. When decompressing a next literal (commonly referred to as "delta literal", which is "E" in this example) of the length-distance pair using the BAC method, a previous literal (the 7$^{th}$ literal "C" in this example) and the next literal (the 4$^{th}$ literal "D" in this example) of the string corresponding to the distance-length pair are used. Therefore, when decompressing "E" using the BAC method, "C" and "D" can only be provided to a front-end for the BAC decompression after the distance-length pair (4, 3) is decompressed by the LZ77 operation, leading to reduced decompression efficiency. Further, compression/decompression utilizing the LZMA method is all implemented through software.

SUMMARY OF THE INVENTION

The invention is directed to a decompression circuit and associated decompression method for effective decompression that solves issues of the prior art.

According to an embodiment of the present invention, a decompression circuit is provided. The first decompression unit performs a first decompression operation on data to generate first decompressed data. The first decompressed data comprises a plurality of literals and a distance-length pair. The second decompression unit receives the first decompressed data, and sequentially performs a second decompression operation on the literals and the distance-length pair to generate second decompressed data. After the second decompression unit receives the distance-length pair from the first decompression unit and before the second decompression unit completes decompressing the distance-length pair, the second decompression unit transmits data required for the subsequent first decompression operation performed by the first decompression unit to the first decompression unit according to the distance-length pair.

According to another embodiment of the present invention, a decompression method is provided. The decompression method comprises: performing a first decompression operation on data to generate first decompressed data, which comprises a plurality of literals and a distance-length pair; and receiving the first decompressed data, and sequentially performing a second decompression operation on the literals and the distance-length pair to generate second decompressed data. The step of sequentially performing the second decompression operation on the literals and the distance-length pair to generate the second decompressed data comprises: After receiving the distance-length pair and before completing decompressing the distance-length pair, replying data required for the subsequent first decompression operation according to the distance-length pair.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
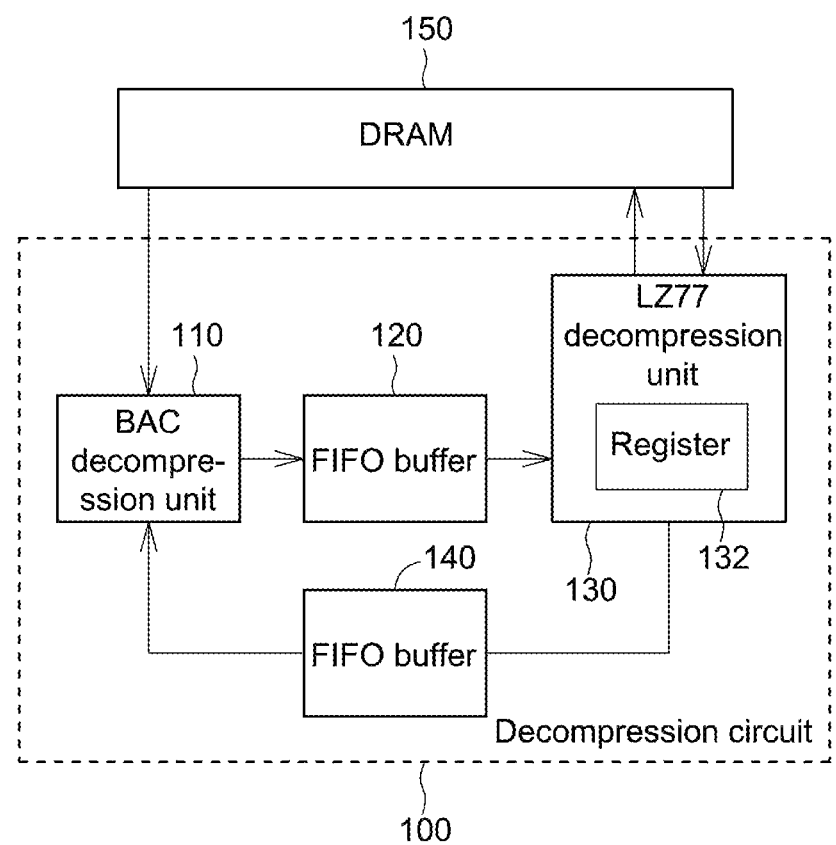
FIG. 1 shows a schematic diagram of a decompression circuit according to an embodiment of the present invention.

FIG. 1 shows a schematic diagram of a decompression circuit 100 according to an embodiment of the present invention. As shown in FIG. 1, the decompression circuit 100, coupled to a dynamic random access memory (DRAM) 150, comprises a first decompression unit (in the embodiment, the first decompression unit is a BAC decompression unit 110), a first-in-first-out (FIFO) buffer 120, and a second decompression unit (in the embodiment, the second decompression unit is an LZ77 decompression unit 130), and a FIFO buffer 140. The LZ77 decompression unit 130 comprises a register 132. Further, in the embodiment, the decompression circuit 100 is an LZMA decompression circuit.

In a BAC compression technique, binary strings are compressed. During a BAC compression process, each bit is categorized by the BAC compression as a distance or a literal, or that the bit is a first bit of a literal. Each category has an independent probability value, which is constantly updated in the compression process. When compressing the bit, the probability value corresponding to the bit is first referred, and the probability value is then updated according to whether a value of the bit is "0" or "1". Details of BAC compression/decompression details are known to a person having ordinary skill in the art, and shall be omitted herein for the sake of brevity.

To perform a decompression operation by the decompression circuit 100, the BAC decompression 110 first receives a data stream from the DRAM 150, and decompresses the data stream to generate first decompressed data. The first decompressed data comprises a plurality of literals and a distance-length pair. The first decompressed data is transmitted via the FIFO buffer 120 to the LZ77 decompression unit 130. The LZ77 decompression unit 130 decompresses the first decompressed data to generate second decompressed data, and transmits the second decompressed data to another circuit. More specifically, in the embodiment, after receiving the distance-length pair from the BAC decompression unit 110 and before completing decompressing the distance-length pair, the LZ77 decompression unit 130 first transmits data required by the subsequent decompression process of the BAC decompression unit 110 via the FIFO buffer 140 back to the BAC decompression unit 110.

For example, assuming that the BAC decompression unit 110 receives a data stream which is compressed data of the string "ABCDABCE" from the DRAM 150, the BAC decompression unit 110 sequentially decompresses the data stream to obtain "A, B, C, D, (4, 3), E", where (4, 3) is a distance-length pair for representing first three literals (i.e., ABC) of four previous literals. In the decompression process performed on the previous four literals "A, B, C, D", the decompression of the latter three literals requires data of a previous literal, respectively. That is to say, the decompression of "B" requires data of "A", and the decompression of "C" requires "B". Thus, the BAC decompression unit 110 is provided with a small buffer therein for temporarily storing data of a previous literal for the subsequent decompression. The BAC decompression unit 110 sequentially transmits the four decompressed literals "A, B, C, D", via the FIFO buffer 120, to the LZ77 decompression unit 130. The LZ77 decompression unit 130 directly transmits "A, B, C, D" to the DRAM 150 and/or another circuit that requires the data. In the embodiment, "A, B, C, D" may be temporarily stored in the register 132 in the LZ77 decompression unit 130 for the use of subsequent decompression.

After decompressing the distance-length pair (4, 3), the BAC decompression unit 110 first determines whether a literal or another distance-length pair follows the distance-length pair (4, 3) to accordingly transmit tag data to the LZ77 decompression unit 130, so as to allow the LZ77 decompression unit 130 to determine whether a next set of data following the received distance-length pair is a literal or another distance-length pair. The tag data may be a bit value or any other data in an appropriate format. For example, in the embodiment, the literal "E" follows the distance-length pair (4, 3). Thus, the BAC decompression unit 110 transmits (1, 4, 3) to the LZ77 decompression unit 130. In (1, 4, 3), "1" indicates that a literal follows the distance-length pair (4, 3). Further, assuming that another distance-length pair follows the distance-length pair (4, 3), the BAC decompression unit 110 may transmit (0, 4, 3) to the decompression unit 130. In (0, 4, 3), "0" indicates that another distance-length pair follows the distance-length pair (4, 3).

It should be noted that, the above description of the BAC decompression unit 110 transmitting the tag data to the LZ77 decompression unit 130 is an example for explaining the embodiment, not limiting the present invention to any specific details. In another embodiment of the present invention, assuming that a literal follows the distance-length pair (4, 3), the BAC decompression unit 110 may transmit tag data to the LZ77 decompression unit 130 to indicate that a literal follows the distance-length pair (4, 3). Assuming that another distance-length pair follows the distance-length pair (4, 3), the BAC decompression unit 110 may not transmit any tag data to the LZ77 decompression unit 130 to indicate that another distance-length pair follows the distance-length pair (4, 3). Given that the BAC decompression unit 110, via appropriate means, informs the LZ77 decompression unit 130 of whether a literal or a distance-length pair follows the distance-length pair (4, 3), it is to be understood that various modifications are within the scope of the present invention.

In the embodiment, as the literal "E" follows the distance-length pair (4, 3), the decompression performed by the BAC decompression unit 110 requires data of a previous literal (the $7^{th}$ literal "C" in this example") and a next literal following a string corresponding to the distance-length pair (the $4^{th}$ literal "D" in this example"). However, the BAC decompression unit 110 does not have the data of "C" and "D". Thus, the BAC decompression unit 110 may only decompress the data stream to obtain the literal "E" after having received the data of "C" and "D" from the LZ77 decompression unit 130. As such, after receiving the distance-length pair (4, 3) and the tag data transmitted from the BAC decompression unit 110 in the previous step, and before decompressing the distance-length pair (4, 3), the LZ77 decompression unit 130 fetches the data of "C" and "D" from its register 132 or the DRAM 150, and transmits "C" and "D" to the FIFO buffer 140 and then to the BAC decompression unit 110 for the BAC decompression unit 110 to obtain "E" through decompression. After transmitting "C" and "D" to the FIFO buffer 140, the LZ77 decompression unit 130 then starts decompressing the distance-length pair (4, 3). Further, in the embodiment, the BAC decompression unit 110 is provided with a small buffer. Data stored in the small buffer is "D" when the LZ77 decompression unit 130 is to obtain the data of "C" and "D". Thus, the LZ77 decompression unit 130 may transmit only data of "C" and directly inform the BAC decompression unit 110 to obtain the data of "D" from the small buffer.

It should be noted that, in the above embodiment, the description of the data of "C" and "D" being first transmitted to the LZ77 decompression unit 130 before the LZ77 decompression unit 130 starts decompressing the distance-length pair (4, 3) is given as an example for explaining the embodiment, not limiting the present invention. In another embodiment of the present invention, given that the data of "C" and "D" is transmitted to the LZ77 decompression unit 130 before the LZ77 decompression unit 130 starts decompressing the distance-length pair, it is to be understood that various modifications are within the scope of the present invention.

Next, the BAC decompression unit 110 and the LZ77 decompression unit 130 may synchronously perform a decompression operation. That is, the time that the BAC decompression unit 110 decompresses to obtain the literal "E" may overlap with the time that the LZ77 decompression unit 130 decompresses the distance-length pair (4, 3). In the process of the LZ77 decompression unit 130 decompressing the distance-length pair (4, 3), in the embodiment, the LZ77 decompression unit 130 sequentially fetches "A", "B", and "C" from the DRAM 150, and transmits the three literals to a circuit requiring the data; the BAC decompression unit 110, after obtaining the literal "E" from decompression, transmits the literal "E" via the FIFO buffer 120 to the LZ77 decompression unit 130 and then to a circuit requiring the data.

Figure 2:
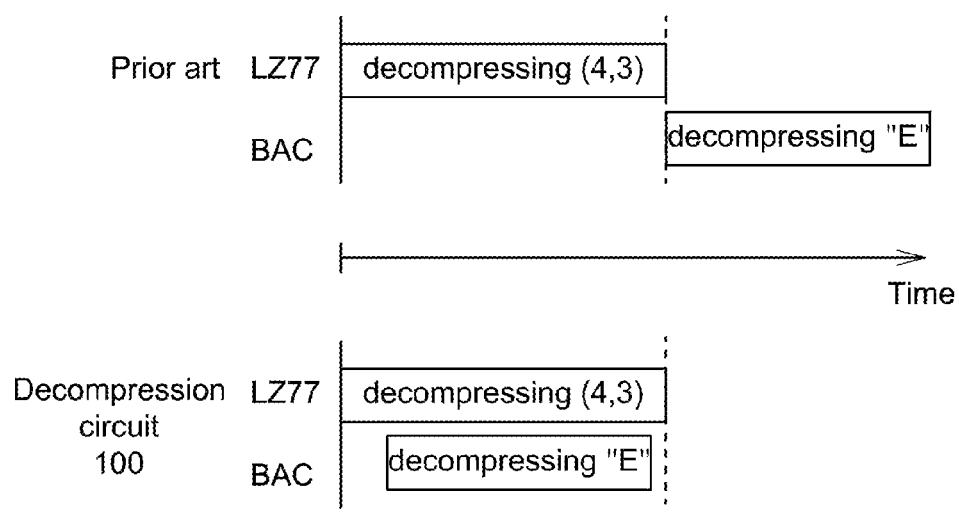
FIG. 2 shows a schematic diagram of a decompression process of the present invention and the prior art.

FIG. 2 shows a schematic diagram of a decompression process of the present invention and a comparison with the prior art. As shown in FIG. 2, in the prior art, the literal "E" is only obtained from BAC decompression after decompressing the distance-length pair (4, 3) using LZ77 decompression, meaning that a longer decompression time is required. In contrast, in the present invention, the time that the BAC decompression unit 110 decompresses and obtains the literal "E" and the time that the LZ77 decompression unit 130 decompresses the distance-length pair (4, 3) can be overlapped, and so an overall decompression time can be reduced to increase decompression efficiency.

It should be noted that, the BAC decompression unit 110 and the LZ77 decompression unit 130 in FIG. 1 are taken as examples for explaining the embodiment, not limiting the present invention. The decompression circuit of the present invention is applicable to decompression operations similar to BAC and LZ77 decompression methods.

Figure 3:
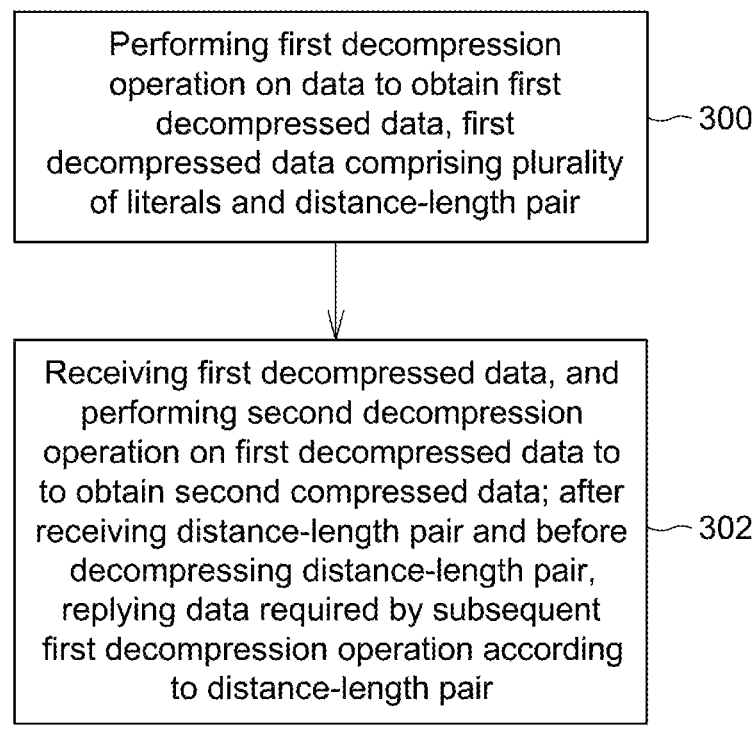
FIG. 3 shows a flowchart of a decompression method according to an embodiment of the present invention.

FIG. 3 shows a flowchart of a decompression method according to an embodiment of the present invention. Referring to FIGS. 1 and 3 as well as the above description associated with the decompression circuit 100, a process of the decompression method comprises the following steps.

In step 300, a first decompression operation is performed on first data to obtain first decompressed data. The first decompressed data comprises a plurality of literals and a distance-length pair.

In step 302, the first decompressed data is received, and a second decompression operation is performed on the first decompressed data to obtain second decompressed data. After receiving the distance-length pair and before completing decompressing the distance-length pair, data required for the subsequent first decompression operation performed is replied according to the distance-length pair.

In conclusion, in the decompression circuit and associated decompression method, after receiving the distance-length pair, the LZ77 decompression unit 130 is capable of immediately transmitting data required by the subsequently decompression operation of the BAC decompression unit 110 to the BAC decompression unit 110. As such, the BAC decompression unit 110 and the LZ77 decompression unit 130 may synchronously perform decompression operations, thereby enhancing decompression efficiency.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A decompression circuit, comprising:
   a first decompression unit, for performing a first decompression operation on data to generate first decompressed data, wherein the first decompressed data comprising a plurality of literals and a distance-length pair; and
   a second decompression unit, for receiving the first decompressed data, and sequentially performing a second decompression operation on the literals and the distance-length pair to generate second decompressed data;
   wherein, after the second decompression unit receives the distance-length pair from the first decompression unit and before the second decompression unit completes decompressing the distance-length pair, the second decompression unit transmits data required by the subsequent first decompression operation to the first decompression unit according to the distance-length pair.

2. The decompression circuit according to claim 1, wherein the data required by the subsequent first decompression operation comprises:
   a last literal of the literals previous to the distance-length pair in the first decompressed data.

3. The decompression circuit according to claim 1, wherein the data required by the subsequent first decompression operation comprises:
   a last literal of a string corresponding to the distance-length pair.

4. The decompression circuit according to claim 1, wherein the first decompression unit is a binary arithmetic coding (BAC) decompression unit, and the second decompression unit is an LZ77 decompression unit.

5. The decompression circuit according to claim 1, wherein after the second decompression unit receives the distance-length pair from the first decompression unit and before the second decompression unit starts to decompress the distance-length pair, the second decompression unit transmits data required by the subsequent first decompression operation to the first decompression unit according to the distance-length pair.

6. The decompression circuit according to claim 1, wherein when the first decompression unit transits the distance-length pair to the second decompression unit, the first decompression unit further transmits tag data to the second decompression unit for the second decompression unit to determine whether data following the distance-length pair is a literal or another distance-length pair.

7. The decompression circuit according to claim 1, wherein when the second decompression unit decompresses the distance-length pair, the first decompression unit performs the first decompression operation according to the data required by the first decompression operation.

8. The decompression circuit according to claim 1, further comprising a memory; wherein, the second decompression unit obtains the data required by the subsequent first decompression operation from the memory according to the distance-length pair and transmits the data to the first decompression unit.

9. The decompression circuit according to claim 1, wherein the second decompression unit further comprises a register, obtains the data required by the subsequent first decompression operation from the register according to the distance-length pair, and transmits the data to the first decompression unit.

10. A decompression method, comprising:
    performing a first decompression operation on data to generate first decompressed data, the first decompressed data comprising a plurality of literals and a distance-length pair; and
    receiving the first decompressed data, and sequentially performing a second decompression operation on the literals and the distance-length pair to generate second decompressed data;
    wherein, the step of sequentially performing the second decompression operation on the literals and the distance-length pair to generate the second decompressed data comprises:
    after receiving the distance-length pair and before completing decompressing the distance-length pair, transmitting data required by the subsequent first decompression operation according to the distance-length pair.

11. The decompression method according to claim 10, wherein the data required by the subsequent first decompression operation comprises:
    a last literal of the literals previous to the distance-length pair in the first decompressed data.

12. The decompression method according to claim 10, wherein the data required by the subsequent first decompression operation comprises:
    a last literal of a string corresponding to the distance-length pair.

13. The decompression method according to claim 10, wherein the first decompression unit is a BAC decompression unit, and the second decompression unit is an LZ77 decompression unit.

14. The decompression method according to claim 10, the step of sequentially performing the second decompression operation on the literals and the distance-length pair to generate the second decompressed data comprises:
    after receiving the distance-length pair and before starting to decompress the distance-length pair, replying the data required by the subsequent first decompression operation according to the distance-length pair.

15. The decompression method according to claim 10, wherein the distance-length pair is transmitted with tag data; the tag data indicates whether data following the distance pair is a literal or another distance-length pair.

16. The decompression method according to claim 10, wherein the first decompression operation is performed according to the data required by the first decompression operation when decompressing the distance-length pair.

* * * * *